(12) United States Patent
Wang et al.

(10) Patent No.: US 10,297,647 B2
(45) Date of Patent: May 21, 2019

(54) CIRCULAR POLARIZER FOR AN ORGANIC LIGHT EMITTING DIODE

(71) Applicant: BOE TECHNOLOGY GROUP CO., LTD., Beijing (CN)

(72) Inventors: Yulin Wang, Beijing (CN); Chun Jan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 15/229,633

(22) Filed: Aug. 5, 2016

(65) Prior Publication Data

US 2017/0133436 A1  May 11, 2017

(30) Foreign Application Priority Data

Nov. 11, 2015  (CN) .............................. 201510763558

(51) Int. Cl.
| | | |
|---|---|---|
| *H01L 29/08* | (2006.01) | |
| *H01L 21/00* | (2006.01) | |
| *H01L 27/32* | (2006.01) | |
| *H01L 51/52* | (2006.01) | |
| *G06F 3/041* | (2006.01) | |

(52) U.S. Cl.
CPC .......... *H01L 27/323* (2013.01); *G06F 3/0412* (2013.01); *H01L 51/5246* (2013.01); *H01L 51/5253* (2013.01); *H01L 51/5281* (2013.01); *G06F 2203/04103* (2013.01)

(58) Field of Classification Search
CPC ............... H01L 27/323; H01L 51/5281; H01L 51/5253; G06F 3/0412
See application file for complete search history.

(56) References Cited

U.S. PATENT DOCUMENTS

| | | | | |
|---|---|---|---|---|
| 7,638,796 B2* | 12/2009 | Kwak | ................ | H01L 51/5281 257/40 |
| 9,104,368 B2* | 8/2015 | Ka | ........................ | G06F 1/1601 |
| 2010/0265206 A1* | 10/2010 | Chen | .................... | G06F 3/0412 345/174 |
| 2011/0163333 A1* | 7/2011 | Adachi | ................ | G02B 5/3016 257/88 |
| 2012/0056211 A1* | 3/2012 | Kitagawa | .............. | B29C 55/026 257/88 |
| 2012/0305981 A1* | 12/2012 | Park | .................... | H01L 51/5253 257/100 |

(Continued)

FOREIGN PATENT DOCUMENTS

| | | |
|---|---|---|
| CN | 103682154 A | 3/2014 |
| CN | 103682157 A | 3/2014 |
| CN | 104637973 A | 5/2015 |

OTHER PUBLICATIONS

Chinese Office Action dated Nov. 27, 2017.

*Primary Examiner* — Alonzo Chambliss
(74) *Attorney, Agent, or Firm* — Dilworth & Barrese, LLP.; Michael J. Musella, Esq.

(57) ABSTRACT

An organic light-emitting diode (OLED) touch display device and a manufacturing method thereof are provided. The OLED touch display device includes an OLED display; and a phase difference plate, a touch layer and a linear polarizer sequentially disposed on a light-emitting side of the OLED display, in which the linear polarizer and the phase difference plate are combined to form a circular polarizer.

14 Claims, 2 Drawing Sheets

(56) References Cited

U.S. PATENT DOCUMENTS

| | | | |
|---|---|---|---|
| 2013/0016047 A1* | 1/2013 | Masumoto | G02F 1/13338 |
| | | | 345/173 |
| 2013/0162560 A1* | 6/2013 | Sun | G06F 3/041 |
| | | | 345/173 |
| 2013/0293069 A1 | 11/2013 | Sakaguchi et al. | |
| 2015/0130736 A1* | 5/2015 | Liu | G06F 3/0412 |
| | | | 345/173 |
| 2015/0169094 A1 | 6/2015 | Liu et al. | |
| 2015/0357597 A1 | 12/2015 | Wang | |
| 2016/0028045 A1 | 1/2016 | He et al. | |
| 2016/0149166 A1* | 5/2016 | Kwong | H01L 51/5293 |
| | | | 257/40 |
| 2016/0155967 A1* | 6/2016 | Lee | G06F 3/0412 |
| | | | 257/88 |
| 2016/0254479 A1* | 9/2016 | Jeong | H01L 51/5256 |
| | | | 257/40 |
| 2018/0124934 A1* | 5/2018 | Franklin | G06F 1/1605 |

\* cited by examiner

CIRCULAR POLARIZER FOR AN ORGANIC LIGHT EMITTING DIODE

TECHNICAL FIELD

The present invention relates to an organic light-emitting diode (OLED) touch display device and a manufacturing method thereof.

BACKGROUND

A touch display only requires a user to touch an icon or text on a display via fingers and hence can achieve operation, so that human-computer interaction can be more straightforward. Currently, touch displays have been widely applied in the field of display technology. In various touch technologies, one glass solution (OGS) technology is an important touch technology. An OGS touch display generally includes a touch screen and a display.

SUMMARY

An embodiment of the disclosure provides An organic light-emitting diode (OLED) touch display device, comprising: an OLED display; and a phase difference plate, a touch layer and a linear polarizer sequentially disposed on a light-emitting side of the OLED display, in which the linear polarizer and the phase difference plate are combined to form a circular polarizer.

Another embodiment of the disclosure provides a method for manufacturing an organic light-emitting diode (OLED) touch display device, comprising: forming a water-oxygen barrier layer on an OLED display; forming a phase difference plate on the water-oxygen barrier layer; forming a touch layer on the phase difference plate; and forming a linear polarizer on the touch layer.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

It should be understood that: in the description of the present invention, the orientation or position relationships indicated by the terms "on", "beneath" and the like are based on the orientation or position relationships as illustrated in the accompanying drawings, are only used for the convenient and simplified description of the present invention, do not indicate or imply that the referred device or element must have a specific orientation and be constructed and operated at the specific orientation, and hence cannot be regarded as the limitation of the present invention.

Figure 1:
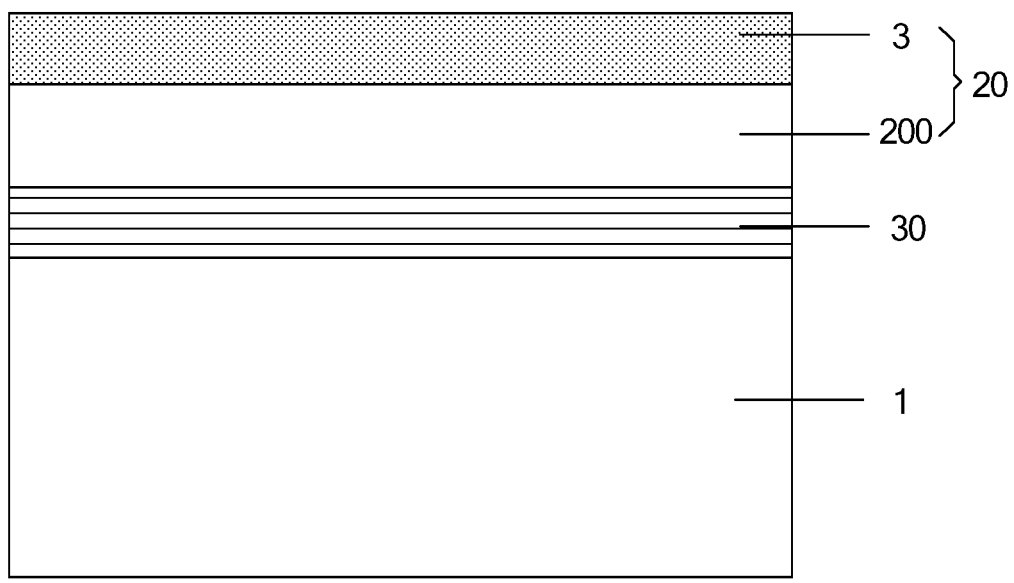
FIG. 1 is a schematic structural view of an OLED touch display device.

In some touch displays, OLED displays are adopted as display screens. In order to reduce the influence of external light on the OLED display, as illustrated in FIG. 1, a circular polarizer 30 is generally disposed between a touch screen 20 and an OLED display 1, and the touch screen 20 includes a touch screen substrate 200 and a touch layer 3 disposed on the touch screen substrate 200. Although the structure can effectively eliminate the influence of the external light on the OLED display, the overall thickness is increased, which is not conducive to the light and thin design of the device.

First Embodiment

Figure 2:
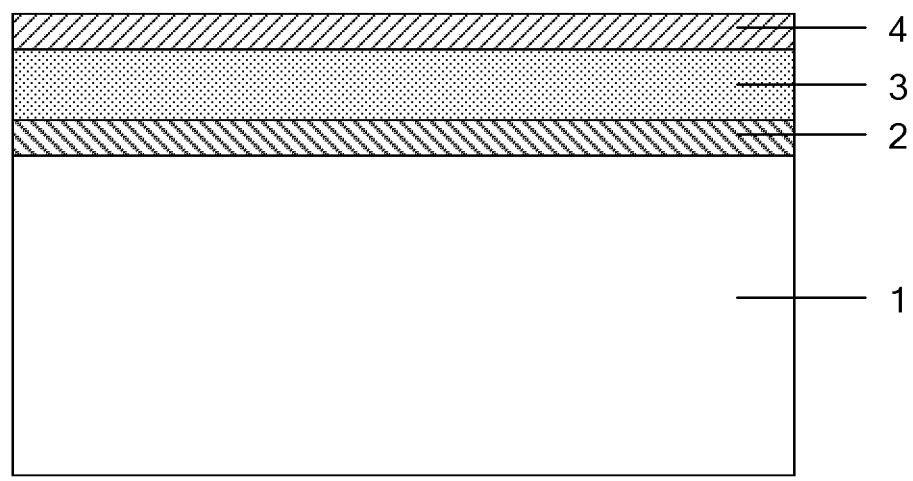
FIG. 2 is a schematic structural view of an OLED touch display device provided by an embodiment of the present invention.

The embodiment of the present invention provides an OLED touch display device. As illustrated in FIG. 2, the display device includes: an OLED display 1 and a phase difference plate 2, a touch layer 3 and a linear polarizer 4 sequentially disposed on a light-emitting side of the OLED display 1. The linear polarizer 4 and the phase difference plate 2 are combined to form a circular polarizer.

In the display device, the specific structure of the OLED display is not limited in the embodiment of the present invention. It can be known by those skilled in the art according to common knowledge and the prior art that: the OLED display can be divided into bottom-emission structure and top-emission structure according to different light-emitting sides. No limitation will be given here in the embodiment of the present invention.

In the display device, the specific type of the phase difference plate is not limited in the embodiment of the present invention, as long as the phase difference plate and the linear polarizer can be combined into the circular polarizer. For instance, a quarter-wave plate is mostly adopted to form the circular polarizer with the linear polarizer, which is conducive to production.

In the display device, the specific structure of the touch layer is not limited in the embodiment of the present invention. Illustratively, the touch layer may include a plurality of touch electrodes, and of course, may also have another structure, as long as the touch function can be achieved.

In the display device, as the touch layer cannot change the vibration direction of light, the arrangement of the touch layer between the linear polarizer and the phase difference plate will not affect the linear polarizer and the phase difference plate, and the circular polarizer formed by the linear polarizer and the retardation pate can still well eliminate the influence of the external light on the OLED display device.

In addition, in some examples, the touch layer includes a touch pattern formed by transparent conductive materials. As the linear polarizer is formed on the touch layer, an independent OC layer may be not provided for the touch layer, so that the thickness of the touch display device can be reduced.

The embodiment of the present invention provides an OLED touch display device. The display device includes: an OLED display and a phase difference plate, a touch layer and a linear polarizer sequentially disposed on a light-emitting side of the OLED display. The linear polarizer and the phase difference plate are combined to form a circular polarizer. In the display device, the touch layer is integrated into the circular polarizer, namely the phase difference plate is taken as a touch screen substrate and the touch layer is disposed on the phase difference plate. In the touch display device in the related art, as the circular polarizer is disposed between the touch screen and the OLED display, the touch screen must be independently provided with a substrate, so that the touch layer can be disposed on the substrate. Compared with the related art, the present invention does not require the touch screen substrate and hence reduces the thickness.

In some examples, the touch layer makes direct contact with the phase difference plate and the linear polarizer respectively. That is to say, the touch layer is directly formed on the phase difference plate, and the linear polarizer is directly formed on the touch layer. Thus, a substrate for forming the touch layer is not required, so that the thickness of the display device can be reduced.

Figure 3:
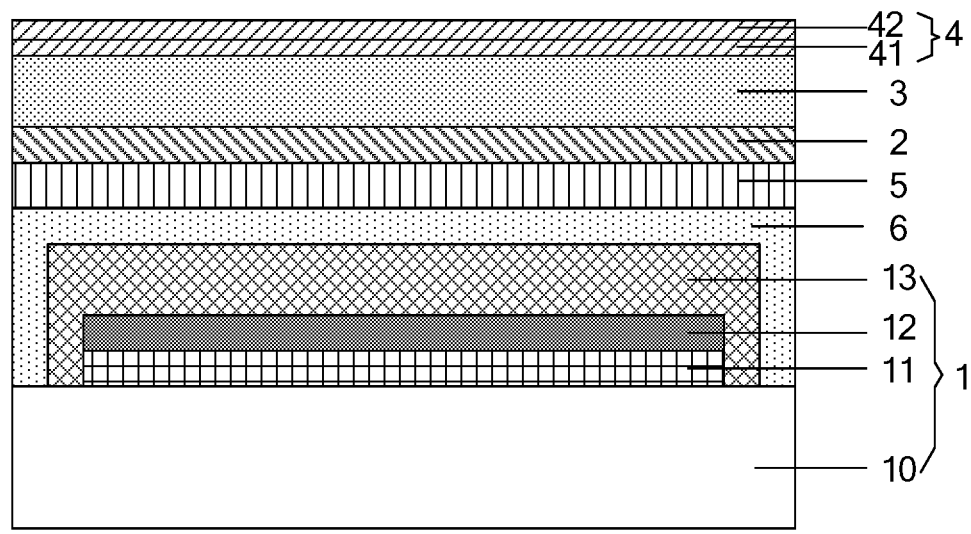
FIG. 3 is a schematic structural view of another OLED touch display device provided by an embodiment of the present invention.

Optionally, as illustrated in FIG. 3, the display device further includes: a transparent water-oxygen barrier layer 5 disposed between an OLED display 1 and a phase difference plate 2. In the related art, in order to protect the OLED display and provide convenience for the subsequent bonding of the touch screen and the circular polarizer, a glass cover plate is usually disposed between the OLED display and the phase difference plate. But the glass cover plate undoubtedly increases the thickness of the entire OLED touch display device, so that the light and thin design cannot be achieved. In the embodiment of the present invention, the water-oxygen barrier layer is disposed between the OLED display and the phase difference plate, can well prevent water, oxygen and the like from entering the OLED display, and hence can protect the OLED display. Meanwhile, compared with the glass cover plate, the water-oxygen barrier layer can greatly reduce the thickness.

Optionally, as illustrated in FIG. 3, the OLED display 1 includes: a substrate 10 and a drive circuit layer 11, a pixel emission layer 12 and an encapsulation layer 13 sequentially disposed on the substrate 10. The encapsulation layer 13 is configured to encapsulate the drive circuit layer 11 and the pixel emission layer 12 together. Light emitted by the pixel emission layer 12 is emitted from the encapsulation layer 13.

It should be noted that the specific structure of the drive circuit layer, the pixel emission layer and the encapsulation layer is not limited in the embodiment of the present invention. Illustratively, the drive circuit layer may include a plurality of thin-film transistors (TFTs) and other structures, and the pixel emission layer may include structures such as a cathode layer, an anode layer and an emission layer (EML) disposed between the cathode and the anode, which can be determined according to actual conditions. Moreover, it should be noted that the OLED display is a top-emission structure, and light emitted by the structure is directly emitted from the encapsulation layer. Compared with a bottom-emission structure (namely light emitted by the pixel emission layer runs through the drive circuit layer and is hence emitted from the substrate), the aperture opening ratio can be effectively improved without being affected by a bottom drive circuit, which is in favor of the integration of the display device and the bottom drive circuit.

Moreover, it should be noted that: as illustrated in FIG. 3, if the OLED display 1 includes the substrate 10 and the drive circuit layer 11, the pixel emission layer 12 and the encapsulation layer 13 sequentially disposed on the substrate 10, the water-oxygen barrier layer 5, for instance, may be disposed between the encapsulation layer 13 and the phase difference plate 2, so that water and oxygen cannot run through the encapsulation layer and enter other structures in the OLED display, and hence the water and oxygen resistance of the OLED display can be improved.

Moreover, optionally, the display device further includes: a photosensitive adhesive disposed between the water-oxygen barrier layer and the OLED display. For instance, as illustrated in FIG. 3, a photosensitive adhesive 6 may be disposed between the water-oxygen barrier layer 5 and the encapsulation layer 13. Thus, the water-oxygen barrier layer and the encapsulation layer are bonded together through the photosensitive adhesive, so that the ability and the mechanical bruise resistance of the OLED display can be further improved.

Optionally, the phase difference plate is a quarter-wave plate. Thus, external light becomes linearly polarized light after running through the linear polarizer; the linearly polarized light becomes circularly polarized light after running through the quarter-wave plate; and the circularly polarized light is reflected by a layer structure making contact with the quarter-wave plate, runs through the quarter-wave plate again, and becomes linearly polarized light perpendicular to the direction of a transmission axis of the linear polarizer. The linearly polarized light cannot run through the linear polarizer, namely is blocked in the circular polarizer, so that the influence of partial external light on the emitted light of the OLED can be eliminated.

Optionally, as illustrated in FIG. 3, the linear polarizer 4 includes: a linear polarization layer 41 making contact with the touch layer 3 and an OC layer 42 for covering the linear polarizer 41. As the linear polarization layer tends to be damaged due to external influence, an OC layer is usually disposed on both sides of the linear polarization layer to improve the utilization ratio. In the present invention, the linear polarization layer is directly formed on the touch layer and the OC layer is only disposed on one side of the touch layer, so that one OC layer can be reduced, and hence the thickness can be further reduced.

Moreover, optionally, the linear polarization layer is made from (Polyvinyl Alcohol) PVA, and the OC layer is made from (Triacetyl Cellulose) TAC. PVA is a high molecular polymer, is dyed by various types of dichroic organic dyes, and meanwhile, is extended under certain humidity and temperature, so as to absorb the dichroic dyes to form the polarization performance. A PVA layer is of hydrophilicity, can soon suffer from deformation, shrinkage, relaxation and recession in hot and humid environment, has low strength, and is breakable and difficult to use and process. A TAC layer has the advantages of high strength, high light transmittance and high resistance to heat and humidity, and hence can well protect the PVA layer.

Optionally, the water-oxygen barrier layer includes: an organic layer and an inorganic layer sequentially disposed on the OLED display. The inorganic layer can block water and oxygen. It should be noted that the inorganic layer is a film made from inorganic materials and the organic layer is a film made from organic materials.

Moreover, optionally, the organic layer may be made from (Polyethylene Terephthalate) PET or (Polyethylene Naphthalate) PEN. The inorganic layer may be made from aluminum oxide, titanium oxide, zirconium oxide, nitrogen oxide, silicon nitride or silicon carbonitride. The water-oxygen barrier layer has high water-oxygen resistance and can better protect the OLED display. Meanwhile, the thickness of the water-oxygen barrier layer may be 50-100 µm. Illustratively, the thickness of the water-oxygen barrier layer may be 60 µm, 70 µm, 80 µm or 90 µm. Compared with the glass cover plate with the thickness of several thousand micrometers, the thickness can be greatly reduced.

Optionally, the encapsulation layer may be one or a combination of the inorganic layer, the organic layer and a mixed layer of inorganic materials and organic materials. Illustratively, the encapsulation layer may only include the inorganic layer, the organic layer or the mixed layer of the inorganic materials and the organic materials; or the encapsulation layer includes two types of layer structures. For instance, the encapsulation layer includes an overlapped layer of the inorganic layer and the organic layer, an overlapped layer of the inorganic layer and the mixed layer, or an overlapped layer of the organic layer and the mixed layer. No specific limitation will be given here. The case can be determined according to actual conditions. It should be noted that the inorganic layer is a film made from the inorganic materials and the organic layer is a film made from the organic materials. The inorganic layer may be made from aluminum oxide, titanium oxide, zirconium oxide, nitrogen oxide, silicon nitride, silicon carbonitride or the like, and has high water-oxygen resistance. The organic layer may be made from polymethyl methacrylate (PMMA) or hexamethyl disiloxane (HMDO), has good planarization function, particle coating function and hole filling function, can effectively block water and oxygen, and meanwhile, is conducive to the light and thin design. The mixed layer may be made from a mixture of silicon dioxide and silicon-carbon long-chain compounds. The thickness of the encapsulation layer may be 1-20 µm. Illustratively, the thickness of the encapsulation layer may be 5 µm, 10 µm or 15 µm.

In the embodiment of the present invention, the photosensitive adhesive may be disposed between adjacent layers among the water-oxygen barrier layer, the phase difference plate, the touch layer and the linear polarizer, and full bonding method may be adopted to form the OLED touch display device with tight structure and strong mechanical resistance. Illustratively, the photosensitive adhesive may be disposed between the water-oxygen barrier layer and the phase difference plate or disposed between the phase difference plate and the touch layer, and may also be disposed between the touch layer and the linear polarizer. No specific limitation will be given here. The case can be determined according to actual conditions.

Second Embodiment

The embodiment of the present invention provides a method for manufacturing an OLED touch display device. The structure of the OLED touch display device may refer to FIG. 3.

Figure 4:
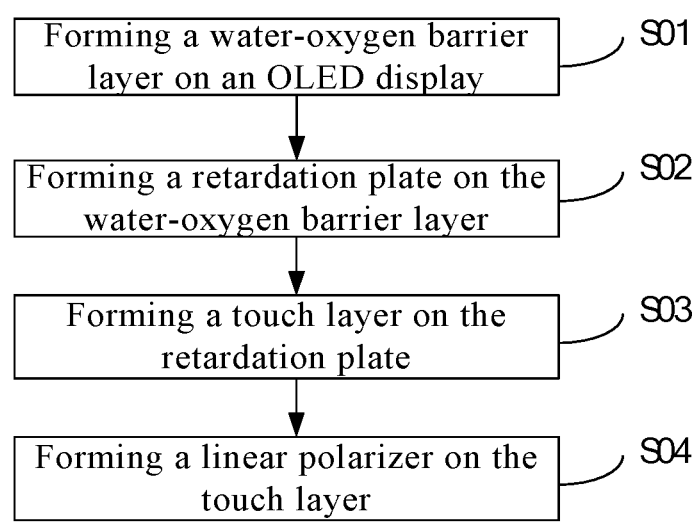
FIG. 4 is a process flowchart of a method for manufacturing an OLED touch display device, provided by an embodiment of the present invention.

As illustrated in FIG. 4, the method comprises:

S01: forming a water-oxygen barrier layer 5 on an OLED display 1;

S02: forming a phase difference plate 2 on the water-oxygen barrier layer 5;

S03: forming a touch layer 3 on the phase difference plate 2; and

S04: forming a linear polarizer 4 on the touch layer 3.

It should be noted that: the water-oxygen barrier layer, the phase difference plate and the linear polarizer may all be formed by roll-to-roll (R2R) process or laminated processing technique; and the touch layer may be formed by the laminated processing technique and cannot be formed by the R2R process as the touch layer includes structures such as electrodes. The R2R process is the process of bonding film materials for forming a layer on a surface of a substrate by a rolling tool, and the laminated processing technique is the process of laminating film materials for forming a layer on a surface of a substrate by bonding and lamination via a flat lamination device.

Moreover, it should be noted that: the photosensitive adhesive may be disposed between adjacent layers among the water-oxygen barrier layer, the phase difference plate, the touch layer and the linear polarizer, and full bonding method may be adopted to form the OLED touch display device with tight structure and strong mechanical resistance. Illustratively, the photosensitive adhesive may be disposed between the water-oxygen barrier layer and the phase difference plate or disposed between the phase difference plate and the touch layer, and may also be disposed between the touch layer and the linear polarizer. No specific limitation will be given here. The case can be determined according to actual conditions.

The embodiment of the present invention provides a method for manufacturing an OLED touch display device. In the OLED touch display device formed by the method, the touch layer is integrated into the circular polarizer, namely the phase difference plate is taken as a touch screen substrate and the touch layer is disposed on the phase difference plate. In the touch display device in the related art, as the circular polarizer is disposed between the touch screen and the OLED display, the touch screen must be independently provided with a substrate, so that the touch layer can be disposed on the substrate. Compared with the prior art, the present invention does not require the touch screen substrate and hence reduces the thickness.

Optionally, as illustrated in FIG. 3, the OLED display 1 includes: a substrate 10 and a drive circuit layer 11, a pixel emission layer 12 and an encapsulation layer 13 sequentially disposed on the substrate 10.

The step of forming the water-oxygen barrier layer 5 on the OLED display 1 in the step S01, for instance, includes: forming the water-oxygen barrier layer 5 on the encapsulation layer 13 of the OLED display 1.

Optionally, before the step of forming the water-oxygen barrier layer 5 on the encapsulation layer 13 of the OLED display 1, the method further comprises: S05: coating a photosensitive adhesive 6 on a surface of one side of the OLED display 1 provided with the encapsulation layer 13. The step of forming the water-oxygen barrier layer 5 on the encapsulation layer 13 of the OLED display 1, for instance, includes: forming the water-oxygen barrier layer 5 on the photosensitive adhesive 6; and bonding the OLED display 1 and the water-oxygen barrier layer 5 together by full bonding method.

For instance, in some examples, the touch layer is directly formed on the phase difference plate, and the linear polarizer is directly formed on the touch layer. Thus, a substrate for forming the touch layer is not required, so that the thickness of the display device can be reduced.

It should be noted here that: in the step of coating the photosensitive adhesive 6 on the surface of one side of the OLED display 1 provided with the encapsulation layer 13 in the step S05, as illustrated in FIG. 2, if the encapsulation layer 13 is disposed on the outermost of the OLED display 1, the photosensitive adhesive 6 may, for instance, be coated on a surface of the encapsulation layer 13 and a surface of the substrate 10 not covered by the encapsulation layer 13. Of course, if other layers are also disposed on the encapsulation layer, the photosensitive adhesive may be coated on surfaces of the layers. No limitation will be given here, as long as the photosensitive adhesive is coated on the surface of one side of the OLED display provided with the encapsulation layer. In actual application, the structure as illustrated in FIG. 2 is more widely applied. Moreover, it should be noted that the photosensitive adhesive may be only coated on the circumference of the surface of one side of the OLED display provided with the encapsulation layer and may also be fully coated. The latter is preferred, so that the OLED display and the water-oxygen barrier layer can be bonded together by full bonding method, and hence the OLED touch display device can have a tight structure and strong mechanical resistance.

The foregoing is only the preferred embodiments of the present invention and not intended to limit the scope of protection of the present invention. The scope of protection of the present invention should be defined by the appended claims.

The application claims priority to the Chinese patent application No. 201510763558.X, filed on Nov. 11, 2015, the disclosure of which is incorporated herein by reference as part of the application.

The invention claimed is:

1. An organic light-emitting diode (OLE)) touch display device, comprising:
an OLED display;
a phase difference plate, a touch layer and a linear polarizer sequentially disposed on a light-emitting side of the OLED display, in which the linear polarizer and the phase difference plate are combined to form a circular polarizer; and
a transparent water-oxygen barrier layer disposed between the OLED display and the phase difference plate,
wherein the touch layer includes a touch pattern formed by a transparent conductive material,
wherein the water-oxygen barrier layer includes: an organic layer and an inorganic layer sequentially disposed on the OLED display,
wherein the OLED display includes an encapsulation layer, and a first photosensitive adhesive is disposed between the water-oxygen barrier layer and the OLED display to cover lateral surfaces and an upper surface of the encapsulation layer.

2. The display device according to claim 1, wherein the OLED display includes: a substrate and a drive circuit layer, a pixel emission layer and an encapsulation layer sequentially disposed on the substrate, in which the encapsulation layer is configured to encapsulate the drive circuit layer and the pixel emission layer together; and light emitted by the pixel emission layer is emitted from the encapsulation layer.

3. The display device according to claim 2, wherein the encapsulation layer is one or a combination of an inorganic layer, an organic layer and a mixed layer of inorganic material and organic material.

4. The display device according to claim 1, wherein the phase difference plate is a quarter-wave plate.

5. The display device according to claim 1, wherein the linear polarizer includes: a linear polarization layer in contact with the touch layer and an overcoat (OC) layer for covering the linear polarization layer.

6. The display device according to claim 5, wherein the linear polarization layer is made from polyvinyl alcohol (PVA), and the OC layer is made from triacetyl cellulose (TAC).

7. The display device according to claim 1, wherein the organic layer is made from polyethylene terephthalate (PET) or polyethylene naphthalate (PEN).

8. The display device according to claim 1, wherein the inorganic layer is made from at least one selected from the group consisting of aluminum oxide, titanium oxide, zirconium oxide, nitrogen oxide, silicon nitride and silicon carbonitride.

9. The display device according to claim 1, wherein the touch layer is in direct contact with the phase difference plate and the linear polarizer respectively.

10. The display device according to claim 1, wherein the first photosensitive adhesive is directly contacted with the water-oxygen barrier layer and the encapsulation layer.

11. The display device according to claim 1, further comprising a second photosensitive adhesive disposed at least one of between the phase difference plate and the touch layer and between the touch layer and the linear polarizer.

12. A method for manufacturing an organic light-emitting diode (OLED) touch display device, comprising:
forming a water-oxygen barrier layer on an OLED display;
forming a phase difference plate on the water-oxygen barrier layer;
forming a touch layer on the phase difference plate; and
forming a linear polarizer on the touch layer,
wherein the touch layer includes a touch pattern formed by a transparent conductive material,
wherein the linear polarizer and the phase difference plate are combined to form a circular polarizer,
wherein the water-oxygen barrier layer includes: an organic layer and an inorganic layer sequentially disposed on the OLED display,
wherein before forming the water-oxygen barrier layer on the encapsulation layer of the OLED display, the method further comprises:
applying a photosensitive adhesive on a surface of one side of the OLED display provided with the encapsulation layer to cover lateral surfaces and an upper surface of the encapsulation layer; and
forming the water-oxygen barrier layer on the encapsulation layer of the OLED display includes: forming the water-oxygen barrier layer on the photosensitive adhesive; and
bonding the OLED display and the water-oxygen barrier layer together.

13. The manufacturing method according to claim 12, wherein the OLED display includes: a substrate and a drive circuit layer, a pixel emission layer and an encapsulation layer sequentially disposed on the substrate; and forming the water-oxygen barrier layer on the OLED display includes:
forming the water-oxygen barrier layer on the encapsulation layer of the OLED display.

14. The manufacturing method according to claim 12, wherein the touch layer is directly formed on the phase difference plate, and the linear polarizer is directly formed on the touch layer.

* * * * *